(12) United States Patent
Eggermont (10) Patent No.: US 10,439,600 B1
(45) Date of Patent: Oct. 8, 2019

(54) TRANSCEIVER METHODS AND SYSTEMS WITH PULSE GENERATOR BASED ON A BOOTSTRAP CAPACITOR

(71) Applicant: SEMICONDUCTOR COMPONENTS INDUSTRIES, LLC, Phoenix, AZ (US)

(72) Inventor: Jean-Paul Eggermont, Pellaines (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/965,131

(22) Filed: Apr. 27, 2018

(51) Int. Cl.
*H03K 3/356* (2006.01)
*H04B 1/40* (2015.01)
*H03K 5/1534* (2006.01)

(52) U.S. Cl.
CPC ..... *H03K 3/356095* (2013.01); *H03K 5/1534* (2013.01); *H04B 1/40* (2013.01)

(58) Field of Classification Search
CPC ......... H04B 1/40; H04B 1/0475; H04B 1/525
See application file for complete search history.

(56) References Cited

U.S. PATENT DOCUMENTS

| | | | |
|---|---|---|---|
| 5,627,460 A | 5/1997 | Bazinet et al. | |
| 5,943,226 A | 8/1999 | Kim | |
| 8,736,324 B2* | 5/2014 | Wong | H03L 7/0995 327/147 |
| 10,170,922 B1* | 1/2019 | Kinzer | H02J 7/0052 |
| 2004/0183932 A1* | 9/2004 | Kasuga | H03M 1/123 348/301 |
| 2013/0169324 A1* | 7/2013 | Huang | H03K 4/502 327/126 |
| 2017/0117803 A1* | 4/2017 | Matsuki | H02M 3/156 |
| 2017/0133929 A1* | 5/2017 | Matsuki | H02M 1/08 |

OTHER PUBLICATIONS

Elmos Semiconductor AG, "4 Channel Multi-Mode PSI5 Transceiver," Data Sheet, QM-No. 25DS0109E.06, Apr. 27, 2016, pp. 1-89.

* cited by examiner

*Primary Examiner* — Shuwang Liu
*Assistant Examiner* — Gina M McKie
(74) *Attorney, Agent, or Firm* — Ramey & Schwaller, LLP (57) ABSTRACT

A transceiver device includes a pulse generator, an output node, and an internal bus that couples the pulse generator and the output node. The pulse generator is configured to selectively add at least one pulse to an outlet power supply signal conveyed by the internal bus to the output node, wherein the pulse generator includes a bootstrap capacitor with a first side coupled to the internal bus and a second side selectively coupled to at least one current source. A transceiver method includes receiving an inlet power supply signal and providing an outlet power supply signal to an output node, wherein the outlet power supply signal is based on the inlet power supply signal. The transceiver method also includes selectively adding a sync or data pulse to the outlet power supply signal based on a pulse scheme and a bootstrap capacitor coupled to the output node.

18 Claims, 7 Drawing Sheets

TRANSCEIVER METHODS AND SYSTEMS WITH PULSE GENERATOR BASED ON A BOOTSTRAP CAPACITOR

BACKGROUND

Modern electronic devices employ various smaller electronic components, each smaller component having one or more predetermined functions, operational limits, and cost. Fabricators of such electronic components may either custom-build electronic components for particular clients or provide electronic components intended to meet the needs of the market (supporting the ongoing sale of electronic devices). Electronic component fabricators compete to provide components that comply with client and market needs.

One example of an electronic component needed in modern electronic devices is a transceiver. A transceiver may be employed, for example, to support transmission and reception of data between internal components of an electronic device and/or to support transmission and reception of data between different electronic devices. Efforts by fabricators to improve transceiver functionality and/or to lower transceiver build cost are ongoing. An example design platform involves decreasing transceiver size, power dissipation, and build cost.

SUMMARY

Accordingly, there is provided herein a transceiver device having a pulse generator, an output node, and an internal bus that couples the pulse generator and the output node. The pulse generator is configured to selectively add at least one pulse to an outlet power supply signal conveyed by the internal bus to the output node, wherein the pulse generator includes a bootstrap capacitor with a first side coupled to the internal bus and a second side selectively coupled to at least one current source.

In at least some embodiments, an electronic control unit (ECU) transceiver for a vehicle includes a data detector, a pulse generator, an output node, and an internal bus that couples to the data detector, the pulse generator, and the output node. The pulse generator is configured to selectively add a data or sync pulse to an outlet power supply signal conveyed by the internal bus to the output node, wherein the pulse generator includes a bootstrap capacitor with a first side coupled to the bus and a second side selectively coupled to at least one current source.

In at least some embodiments, a transceiver method includes receiving an inlet power supply signal and providing an outlet power supply signal to an output node, wherein the outlet power supply signal is based on the inlet power supply signal. The transceiver method also includes selectively adding a sync or data pulse to the outlet power supply signal based on a pulse scheme and a bootstrap capacitor with a top side coupled to the output node.

Each of the foregoing embodiments may be implemented in combination and/or may include one or more of the following features in any combination: (a) the pulse generator includes a pulse manager that enables the second side of the bootstrap capacitor to be selectively connected to different current sources and to ground; (b) at least one of the different current sources is powered by an internal bus power supply signal; (c) the pulse manager adds a synchronization pulse having a predetermined shape to the outlet power supply signal; (d) the pulse manager adds a data pulse to the outlet power supply signal, and wherein the data pulse has a different shape than the synchronization pulse; (e) the transceiver includes a modulated data detector coupled to the internal bus; (f) the output node, the internal bus, and the pulse generator are components of an integrated circuit; (g) the pulse generator provides pulses to a plurality of channels; (h) the at least one current source is configured to provide a first current to the second side of the bootstrap capacitor to add a rising edge of the data or sync pulse to the outlet power supply signal, and wherein the at least one current source is configured to provide a second current to the second side of the bootstrap capacitor to maintain the data or sync pulse at a threshold level above the outlet power supply signal for a predetermined duration; (i) the second side of the bootstrap capacitor is disconnected from the current source and is grounded for a predetermined duration to add a falling edge of the data or sync pulse to the outlet power supply signal; (j) wherein sensing operations of the data detector account for an amount of current applied to recharge the bootstrap capacitor when completing a pulse; (k) the data detector, the network interface, the output node, the internal bus and the pulse generator are components of an integrated circuit; (l) the ECU transceiver corresponds to a peripheral sensor interface (PSI) transceiver configured to add sync or data pulses to the outlet power supply signal without a charge pump; (m) the pulse generator supports a plurality of channels; (n) the pulse scheme comprises providing a first current to a bottom side of the bootstrap capacitor to add a rising edge of the data or sync pulse to the outlet power supply signal, and wherein the pulse scheme further comprises providing a second current to the bottom side of the bootstrap capacitor to maintain the data or sync pulse at a threshold level above the outlet power supply signal for a predetermined duration; (o) the pulse scheme further comprises grounding the bottom side of the bootstrap capacitor for a predetermined duration to add a falling edge of the data or sync pulse to the outlet power supply signal; (p) the pulse scheme provides sync or data pulses in compliance with peripheral sensor interface 5 (PSI5); and (q) the transceiver method includes receiving modulated current from a sensor, measuring the modulated current, and adjusting the measured current based on a measured or estimated current used to recharge the bootstrap capacitor when completing a data or sync pulse.

It should be understood that the drawings and corresponding detailed description do not limit the disclosure, but on the contrary, they provide the foundation for understanding all modifications, equivalents, and alternatives falling within the scope of the appended claims.

Terminology

In the following description, a "bootstrap arrangement" refers to a bootstrap capacitor connected between a power supply line and a current source to enable alteration of the voltage level on the power supply line. By careful selection of the bootstrap capacitor size, the timing of and the current levels applied to the bootstrap capacitor, and discharge timing, a pulse with specific pulse parameters (e.g., pulse level, rising edge, pulse duration, falling edge) can be added to the voltage level conveyed by an outlet power supply line. As an example, the bootstrap capacitor size, the timing of and the current levels applied, and discharge timing, can be selected to ensure the resulting pulse parameters comply with sync or data signaling requirements of a transceiver communication protocol. As needed, the bootstrap capacitor is recharged after a discharge (i.e., after a falling slope). One of ordinary skill in the relevant art would recognize that pulse generation using a bootstrap arrangement as described herein is distinct from a charge pump technique that charges a capacitor using a voltage source and later applies the charged capacitor voltage to an outlet power supply line using switches. Also, it should be recognized that bootstrap arrangements often include a diode. As used herein, a bootstrap arrangement does not require a diode.

In the following description, an "inlet power supply signal" refers to a power supply signal that is received by a transceiver device from an external source. Meanwhile, an "internal bus power supply signal" refers to a power supply signal that resides on an internal or "local" bus inside a transceiver device. For example, an internal bus power supply signal may be a modified and/or protected version of an inlet power supply signal. Also, an "outlet power supply signal" refers to a power supply signal that leaves the transceiver device and is intended for another component external to the transceiver device. The outlet power supply signal may be a modified or protected version of an inlet power supply signal or internal bus power supply signal. Also, the term "couple" or "couples" refers to a direct or indirect electrical connection between components.

DETAILED DESCRIPTION

Disclosed herein are transceiver devices, systems, and methods, which employ a pulse generator based on a bootstrap arrangement. The disclosed transceiver devices, systems, and methods use the bootstrap arrangement, for example, to add sync or data pulses to an internal bus carrying an outlet power supply signal. With the disclosed bootstrap arrangement, the size (e.g., the area/footprint), power dissipation, and build cost of transceiver embodiments are reduced relative to transceivers that use a charge pump for comparable pulse operations. In one example, a bootstrap arrangement is at least four times smaller (in integrated circuit area) than charge pump components. The reductions are, at least in part, due to replacing charge pump components (capacitors and switches) with bootstrap arrangement components (eliminating and/or reducing the size of some components). For example, a bootstrap capacitor size is small relative to comparable charge pump capacitors. Also, in at least some embodiments, available power for a transceiver (e.g., an internal bus power supply signal) can be leveraged to drive pulse operations using a bootstrap arrangement. This eliminates or reduces some switching and/or power dissipation for pulse operations relative to a charge pump technique. In at least some embodiments, bootstrap arrangement components are included as internal components of an integrated circuit for a transceiver device.

In at least some embodiments, a bootstrap capacitor has a first side coupled to an internal bus carrying an outlet power supply signal and a second side selectively coupled to one or more current sources. In an example pulse scheme, the one or more current sources provide a first current to the second side of the bootstrap capacitor to add a rising edge of a data or sync pulse to the outlet power supply signal (the bootstrap capacitor takes on a supply source role by discharging to the outlet power supply signal). Once the pulse reaches a target voltage level (by partially discharging the bootstrap capacitor), the one or more current sources provide a second current to the second side of the bootstrap capacitor to maintain the data or sync pulse at the target voltage level above the outlet power supply signal for a predetermined duration (the bootstrap capacitor continues to discharge to the outlet power supply signal to maintain the target voltage level). To add a falling edge of the data or sync pulse, the second side of the bootstrap capacitor is disconnected from the one or more current sources and is grounded, resulting in a net charging of the bootstrap capacitor by the outlet power supply signal (pulling down the voltage level of the outlet power supply signal). After being charged by the outlet power supply signal (i.e., after the falling edge of the generated pulse is complete), the pulse scheme is complete. As needed, any current sensing operations of a transceiver can account for an amount of internal bus power supply signal current used to recharge the bootstrap capacitor.

In at least some embodiments, the disclosed bootstrap arrangement may result in a capacitance along an external bus or transceiver output that is greater than a maximum allowed capacitance for a given specification. To account for this issue, the bootstrap capacitor is "transparent" or "floating" relative to the external bus or transceiver output and/or high impedance drivers are used when applying current to the bootstrap capacitor. In operation, the bootstrap capacitor acts as a voltage level shifter by pushing/pulling current on the low side (the side not connected to the external bus or transceiver output.

In at least some embodiments, a bootstrap arrangement is used with transceiver devices included with electronic control units (ECUs) for a vehicle. In such case, transceiver device operations including pulse parameters may conform to a specification such as peripheral sensor interface 5 (PSI5). It should be understood that transceivers with bootstrap arrangements, as described herein, are not limited to ECUs and related consumer products. Also, transceivers with a bootstrap arrangement may conform to other specifications or market needs.

Figure 1:
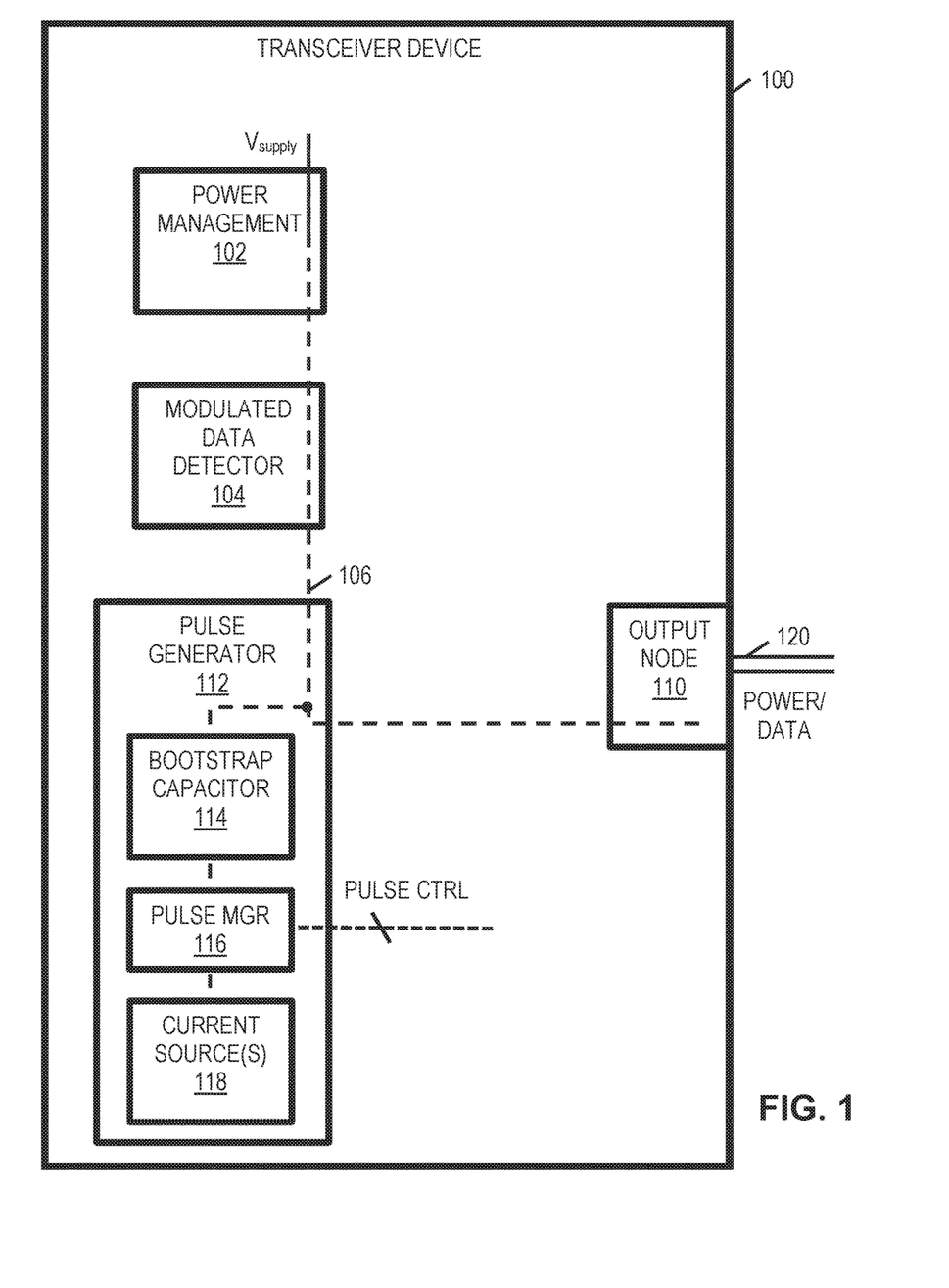
FIG. 1 is a block diagram showing an illustrative transceiver device.

FIG. 1 is a block diagram showing an illustrative transceiver device 100. As shown in FIG. 1, the transceiver device 100 includes various components coupled to an internal bus 106 (shown as a dashed line). In at least some embodiments, the transceiver device 100 includes a power management block 102, a modulated data detector 104, a pulse generator 112, and an output node 110 coupled to the internal bus 106. When the transceiver device 100 is coupled to an external component (not shown), an external bus 120 that carries power/data extends from the output node 110 to the external component.

In operation, the power management block 102 receives an inlet power supply signal ($V_{supply}$) and controls a voltage level on the internal bus 106. The power management block 102 can include, for example, an on/off switch and/or voltage adjustment components. $V_{supply}$ can be provided, for example, by a voltage source external to the transceiver device 100. In the embodiment of FIG. 1, the modulated data detector 104 corresponds to a current sense component. In other embodiments, the modulated data detector 104 may include a voltage sense component and/or other modulated data sensing components.

In the embodiment of FIG. 1, the pulse generator 112 comprises a bootstrap arrangement that includes a bootstrap capacitor 114, a pulse manager 116, and current source(s) 118. The bootstrap capacitor 114 has a first side coupled to the internal bus 106 and a second side coupled to the current source(s) 118 via the pulse manager 116. In FIG. 1, the pulse manager 116 is directed by one or more control signals (PULSE CTRL). As an example, in at least some embodiments, the pulse manager 116 includes at least two switches and slope control. For example, to generate a pulse on top of an outlet power supply signal carried by the internal bus 106, a switch of the pulse manger 116 may be directed by an "open/close" control signal to connect the second side of the bootstrap capacitor 114 to a first of the current source(s) 118, which causes the bootstrap capacitor 114 to develop a charge across its plates. The bootstrap capacitor 114 is partially discharged to raise the voltage level of the outlet power supply signal to a target voltage level by this process. To control the slope of the pulse's rising edge (i.e., how quickly the bootstrap capacitor 114 is discharged), a slope control signal (PULSE CTRL) may be applied to, or applied separate from, the "open/close" control signal to adjust a first current level applied by the first of the current source(s) 118 to the second side of the bootstrap capacitor 114.

Once the pulse reaches a target voltage level, another "open/close" control signal may cause a switch of the pulse manager 116 to connect the second side of the bootstrap capacitor 114 to a second of the current source(s) 118. As needed, a slope control signal can again be used (e.g., applied to, or applied separate from, an "open/close" signal for the second switch of the pulse manager 116) to adjust the amount of current applied by the second of the current source(s) 118 to the second side of the bootstrap capacitor 114. The second current level is applied by the second of the current source(s) 118 to the second side of the bootstrap capacitor 114 to maintain the target voltage level above the outlet power supply signal (by ongoing discharge of the bootstrap capacitor 114) until the duration of the pulse reaches a target duration. Once the pulse reaches the target duration, another control signal directs a switch of the pulse manager 116 to connect the second side of bootstrap capacitor 114 to ground instead of the current source(s) 118. With the second side of the bootstrap capacitor 114 connected to ground, the bootstrap capacitor 114 is charged by the outlet power supply signal resulting in a falling edge for the pulse added to the outlet power supply signal. Once the falling edge for a pulse is complete, the pulse scheme disconnects the second side of the bootstrap capacitor 114 from the current source(s) 118 and ground until another pulse is needed. As desired, the amount of current removed from the outlet power supply signal to charge the bootstrap capacitor 114 (when completing a pulse's falling edge) can be accounted for should current sensing operations be performed by the transceiver device 100.

In some embodiments, the transceiver device 100 supports multiple channels (each supporting one or more external devices). In such embodiments, each channel may have its own output node. Also, each channel may have its own pulse generator with bootstrap arrangement. Alternatively, a pulse generator with bootstrap arrangement (e.g., pulse generator 112) can be shared by multiple channels. In such case, the transceiver device 100 may employ components that enable sharing (e.g., controllers, switches, timers, etc.) the pulse generator 112 across multiple channels.

Figure 2:
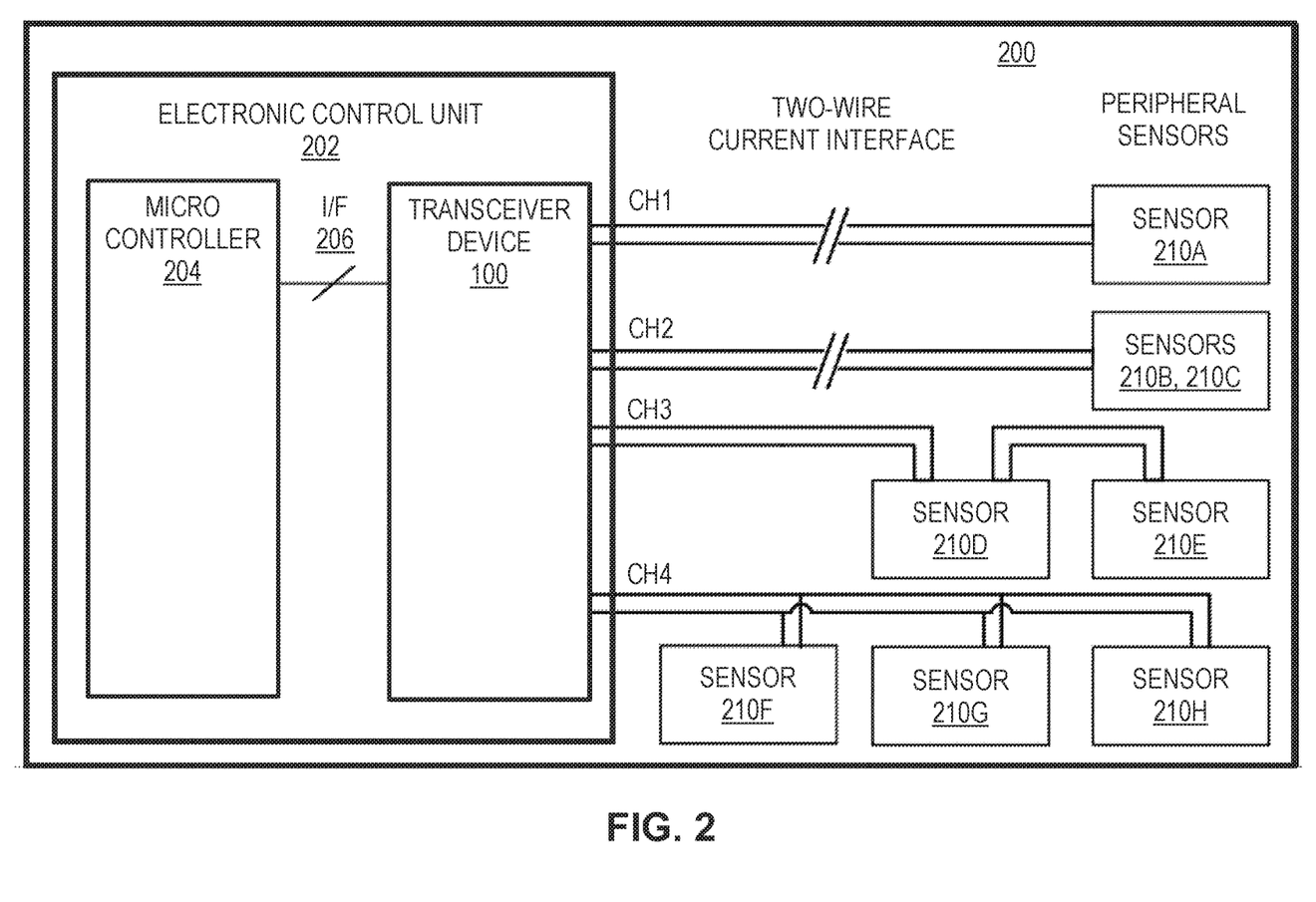
FIG. 2 is a block diagram showing an illustrative system employing the transceiver device of FIG. 1.

FIG. 2 is a block diagram showing an illustrative system 200 employing the transceiver device 100 of FIG. 1. In the system 200 of FIG. 2, the transceiver device 100 is part of an electronic control unit (ECU) 202 that communicates with various sensors 210A-210H. As used herein, an ECU is a term of art that refers to a controller used with a vehicle. However, it should be understood that different ECU designs exists and that the transceiver device 100 could be used in other scenarios. As shown in FIG. 2, the ECU 202 includes a microcontroller 204 in communication with the transceiver device 100 via an interface 206. In operation, the microcontroller 204 provides at least some of the signals used to direct the transceiver device 100. Also, the microcontroller 204 may monitor functionality of the transceiver device 100 as well as receive and process sensor data (e.g., from sensors 210A-210H) received by the transceiver device 100. Further, the microcontroller 204 may direct other components in response to the processed data. For example, ongoing control or monitoring operations of a vehicle may rely on signals or instructions from the microcontroller 204.

In accordance with at least some embodiments, the transceiver device 100 of ECU 202 is configured to provide power to and communicate with sensors 210A-210H. More specifically, the transceiver device 100 of FIG. 2 is shown to support four channels (CH1-CH4) that provide power/data to the sensors 210A-210H. Specifically, CH1 couples the transceiver device 100 to sensor 210A in a point-to-point configuration. CH2 couples the transceiver device 100 to sensors 210B and 210C in a point-to-point configuration, where sensors 210B and 210C are part of a dual sensor package. CH3 couples the transceiver device 100 to sensors 210D and 210E in a serial bus (daisy chain) configuration. CH4 couples the transceiver device 100 to sensors 210F, 210G, and 210H in a parallel bus or star topology configuration. Regardless of the particular coupling scheme employed between the transceiver device 100 and external components such as sensors 210A-210H, a pulse generator with a bootstrap arrangement can be used to provide sync or data pulses to each channel.

Figure 3:
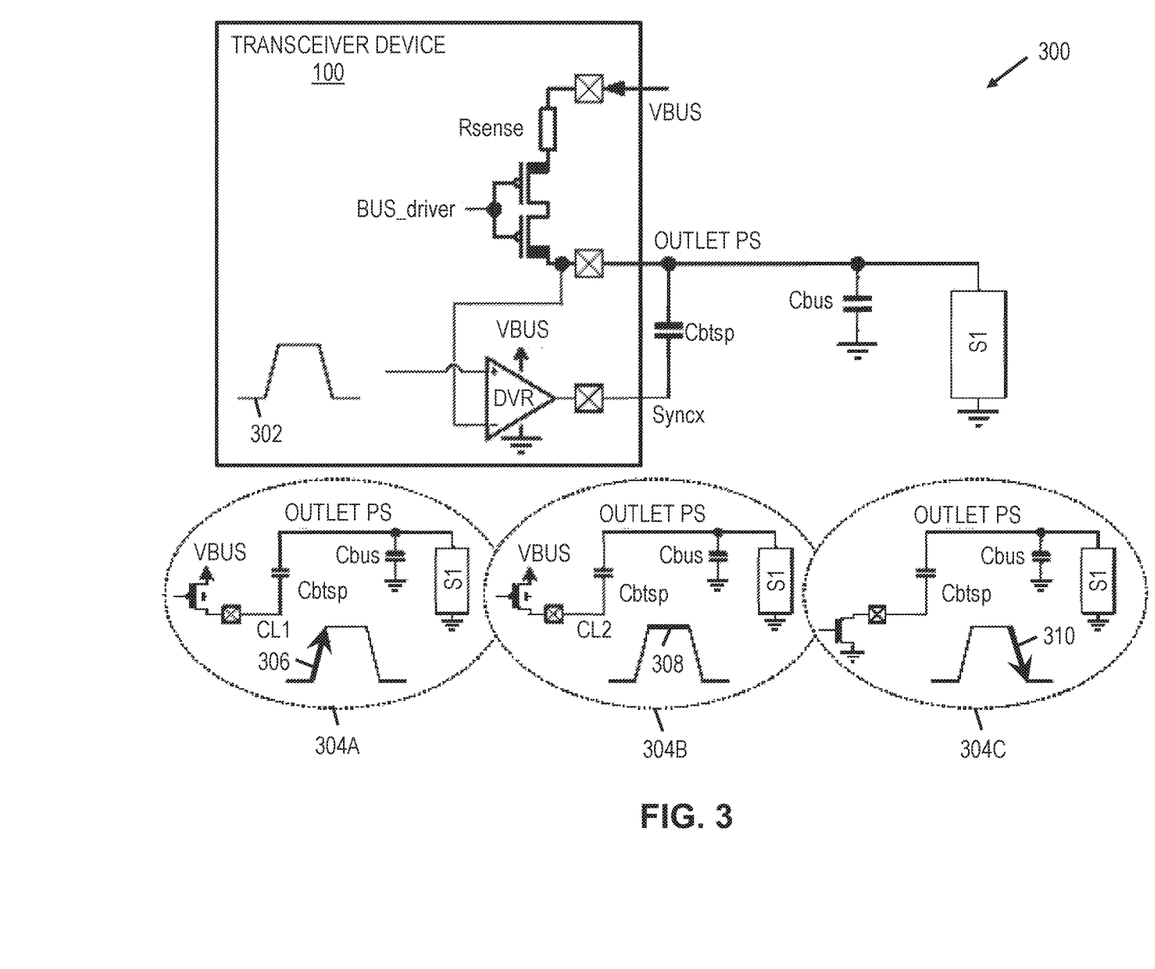
FIG. 3 shows a circuit diagram and pulse scheme for an illustrative transceiver device.

FIG. 3 shows a circuit diagram and pulse scheme for an illustrative transceiver device such as the transceiver device 100 of FIGS. 1 and 2. In FIG. 3, the transceiver device 100 is shown to include a resistor, Rsense, that can be used for current sensing (e.g., by detecting a voltage drop across Rsense). Thus, Rsense may correspond to one of the components of the modulated data detector 104 in FIG. 1. The transceiver device 100 of FIG. 3 also includes two transistors that operate as a switch. When the BUS_driver signal to the transistors is set to a "close circuit" value, the transistors allow a VBUS signal (an internal bus power supply signal) to pass to an output node. Otherwise, the BUS_driver signal can be set to an "open circuit" value, such that the VBUS signal does not pass through the switch. The switch represented in FIG. 3 corresponds to one of the components of the power management block 102 of FIG. 1. When the switch is closed, the VBUS signal is available as an outlet power supply signal (OUTLET PS) for at least one channel of the transceiver device 100. As desired, the outlet power supply signal can be modified by application of a current to the low-side (in FIG. 3) of a bootstrap capacitor (Cbtsp) coupled to the internal bus carrying the outlet power supply signal. The current applied to the low-side of Cbtsp is provided by a driver (DVR). In at least some embodiments, DVR is powered by the VBUS signal and operates in accordance with a pulse scheme 302. In FIG. 3, Cbtsp and DVR correspond to components of the pulse generator 112 of FIG. 1. More specifically, Cbtsp corresponds to the bootstrap capacitor 114 and DVR corresponds to components of the pulse manager 116 and/or the current source(s) 118. As needed, a sync or data pulse is added to the outlet power supply signal and is carried to an external component (S1), which may represent a sensor or other external component. The external bus between the transceiver device 100 and S1 is shown to have a capacitance represented by a capacitor (Cbus).

In at some embodiments, the position of Rsense and the VBUS switch shown in FIG. 3 may be reversed (i.e., Rsense may be positioned below the VBUS switch). Also, the top transistor of the VBUS switch in FIG. 3 is connected in reverse to be able to block the current when Cbtsp takes the lead by forcing the outlet power supply bus above its nominal level (VBUS). In some embodiments, this blocking feature can be performed using a diode.

The pulse scheme 302 of FIG. 3 corresponds to operations of the pulse manager 116 of FIG. 1 and is represented in greater detail by operational phases 304A, 304B, and 304C. In phase 304A, a control signal is applied to a transistor of the DVR to provide a first current level (CL1) to the second (low) side of Cbtsp. The first current level causes discharging of Cbtsp such that a pulse rising edge 306 is added to a base outlet power supply signal. After the rising edge for the pulse has reached a target voltage level above the base outlet power supply signal, phase 304B begins. In phase 304B, a control signal is applied to a transistor (the same transistor or another transistor) of the DVR to provide a second current level (CL2) to the second side of Cbtsp. The second current level enables a pulse "on" level 308 to be maintained above the base outlet power supply signal for a target duration. Once the target duration is reached, phase 304C begins. In phase 304C, a control signal is applied to another transistor of the DVR to connect the second side of Cbtsp to ground. Connecting the second side of Cbtsp to ground causes charging of Cbtsp using the outlet power supply signal such that a pulse falling edge 310 is added to the outlet power supply signal. When transceiver 100 is connected to an external component, such as S1, it should be recognized that part of the charge of Cbtsp may be consumed to provide current to the external component.

Once the falling edge for a pulse is complete (by charging Cbtsp using the outlet power supply signal), Cbtsp is disconnected from current sources and ground such that the base outlet power supply signal remains. With the second side of Cbtsp disconnected from current sources and ground, Cbtsp does not significantly affect ongoing transceiver device operations. If the transceiver device 100 performs current sense operations (e.g., using Rsense) and the recharge current for Cbtsp comes from the VBUS signal, the current used to charge Cbtsp (when completing a pulse) can be accounted for. As an example, if a current sense measurement is made at or near the pulse falling edge 310, a calculated or estimated current amount taken from the VBUS signal to recharge Cbtsp can be added to the current sense measurement.

In FIG. 3, the use of current sources (inside DVR and represented by the transistors of 304A, 304B and 304C), enables the capacitance of the Cbtsp to not be "visible" on the external bus. Thus, even if DVR is adjusting the voltage conveyed to the external bus by means of a slope regulation loop (controlling the value of the DVR current sources to make sure the external bus signal includes the desired pulse), the external bus capacitance remains Cbus. Regardless of the particular values for the external bus capacitance (Cbus may vary) and Cbtsp, the value of Cbtsp will not be summed to Cbus as long the impedance of the current sources is sufficiently high. In some embodiments, the current source(s) 118 could be implemented by a switch or voltage source having a sufficiently low impedance. However, with these alternative options, "loading" of the external bus occurs, necessitating another bootstrap capacitor. The particular bootstrap arrangement can be selected to conform with a given communication protocol (some protocols may allow loading of the external bus). In the embodiment of FIG. 3, Cbtsp is intended to be "transparent" from the external bus.

Example values for various components of FIG. 3 and for current values used to generate a pulse are now given herein for clarity. The example values are not intended to be limiting. In an example embodiment, Cbtsp has a value of 3.3 µF, Cbus has a value of 100 nF, and VBUS has a value of 5 volts. With these values, an example pulse phase 304A involves applying a first current level of 135 mA to the second side of Cbtsp. In such case, S1 draws 35 mA (i.e., the S1 load is 35 mA) and Cbus draws 100 mA. In pulse phase 304B, a second current level of 35 mA is applied to the second side of Cbtsp. In such case, S1 continues to draw 35 mA. In pulse phase 304C, 65 mA is drawn from the second side of Cbtsp towards ground. In such case, S1 continues to draw 35 mA and 100 mA is drawn from Cbus.

Figure 4:
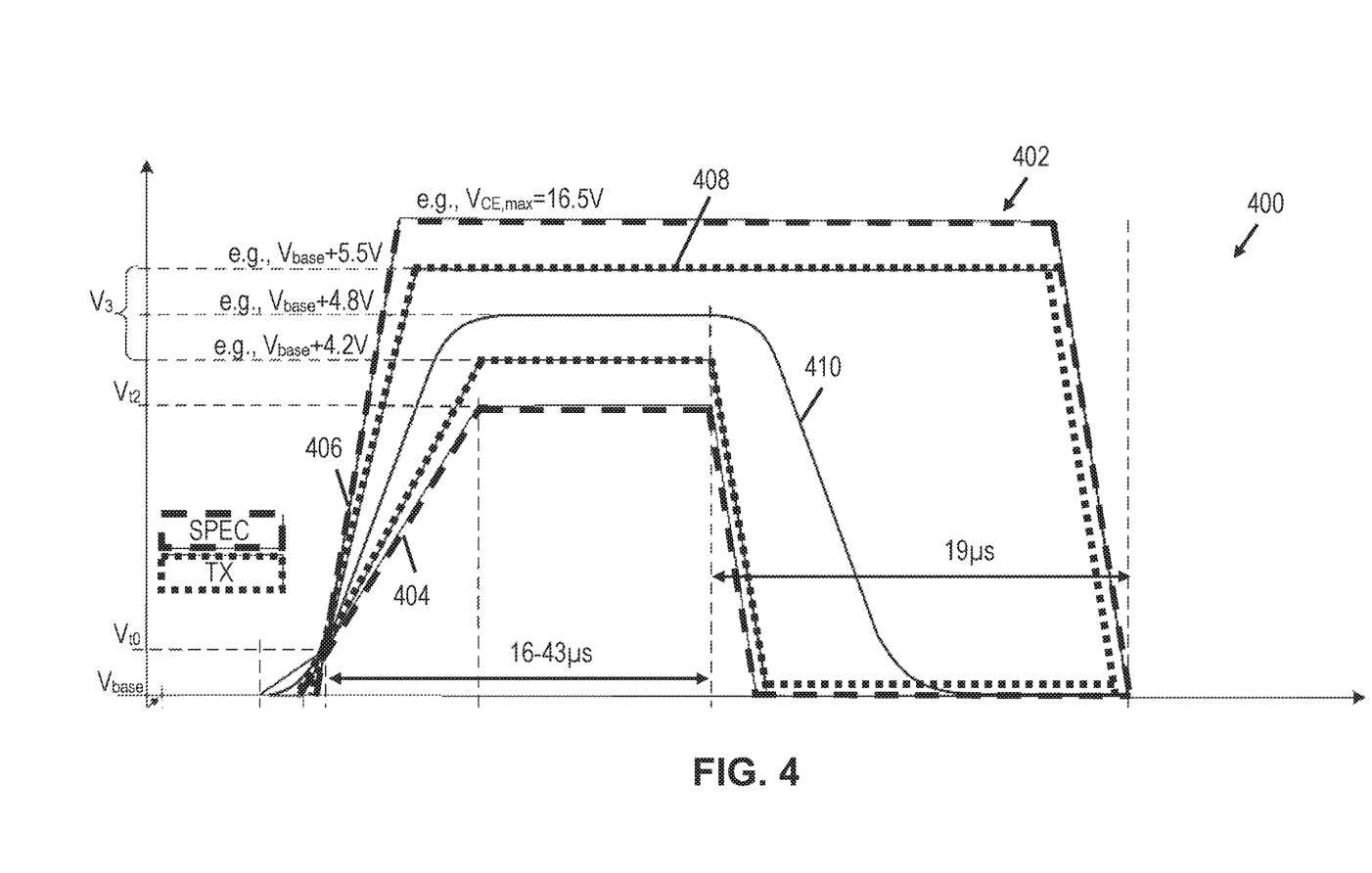
FIG. 4 is a graph showing illustrative pulse windows and a pulse.

FIG. 4 is a graph 400 showing an illustrative pulse windows 402, 408 and a pulse 410. Without limitation to other pulse embodiments, the pulse window 402 represented in graph 400 follows criteria set by the PSI5 specification. It should be understood that other specifications or protocols may be supported with corresponding adjustments to the bootstrap capacitor 114 and the pulse scheme employed. In graph 400, the pulse window 402 is shown in bolded dashed lines. More specifically, the pulse window 402 is formed, starting at an initial voltage level ($V_{t0}$), by a minimum slope 404 and a maximum slope 406. The pulse window 402 further defines parameters such as a minimum pulse duration, a maximum pulse duration, a minimum pulse target level, a maximum pulse target level, and a maximum falling edge slope.

In accordance with at least some embodiments, the pulse window 408 for the transceiver device 100 is designed to fit within the pulse window 402. In graph 400, the pulse window 408 is shown using dotted bold lines. By careful selection of a bootstrap capacitor value, the timing and the current levels applied to the bootstrap capacitor, and the timing of grounding the bootstrap capacitor, a pulse 410 that fits within the pulse windows 402 and 408 is achieved.

In accordance with at least some embodiments, a rising edge for a pulse has a slope of around 0.44 to 1.5V/µs and a duration of around 5 µs is expected. Further, the maximum pulse time may be approximately 50 µs, a minimum overcurrent limitation may be about 110 mA, and a maximum charge lost due to the pulse may by about 5.5 µC. Further, a minimum pulse target level may be about 2*VBUS−1.5V and the VBUS value (on which $V_{base}$ is based) may be between 5.2 to 7.7V. With the pulse windows 402 and 408 of FIG. 4, a bootstrap capacitor value of 2.4 µF can provide the max pulse target value.

Figure 5:
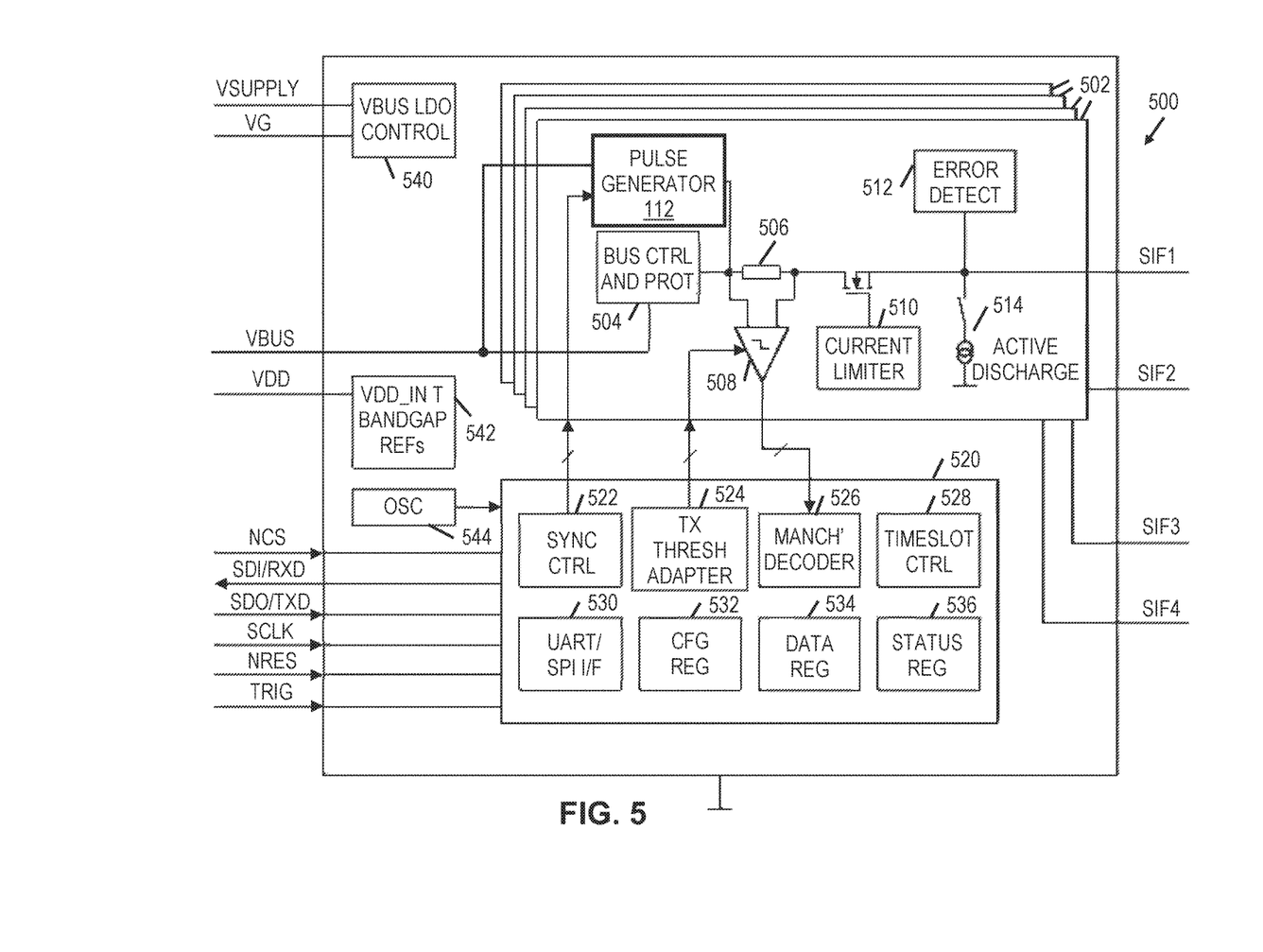
FIG. 5 is a block diagram showing an illustrative electronic control unit (ECU) transceiver.

FIG. 5 is a block diagram showing an illustrative ECU transceiver 500. As shown in FIG. 5, the ECU transceiver 500 supports four sensor interface channels (SIF1-SIF4). For each of the channels, there is an analog component set 502. As shown, each analog component set 502 includes a pulse generator 112 (with bootstrap arrangement) along with various other components such as bus control and protection circuitry 504, a current sensor 506, a digitizer 508 for the current sensor 506, a current limiter 510, error detection circuitry 512, and active discharge circuitry 514. In operation, each analog component set 502 supports the transceiver functions described herein, including performing sync and data pulse operations with a bootstrap arrangement instead of a charge pump arrangement.

The ECU transceiver 500 also includes a digital component set 520 to support transceiver operations. As shown, the digital component set 520 includes a sync control block 522, a transmitter threshold adapter 524, a Manchester decoder 526, a timeslot controller 528, a UART/SPI interface 530, a CFG register 532, a data register 534, and a status register 536. The ECU transceiver 500 also includes other components, including a VBUS LDO (low drop out) controller 540, VDD_IN T bandgap references 542, and an oscillator 544. Table 1 below provides a description of the input and output signals for the ECU transceiver 500.

TABLE 1

| Name | Type | Description |
| --- | --- | --- |
| VSUPPLY | HV_S | Supply Voltage |
| VG | HV_A_O | Gate voltage for external transistor |
| VBUS | HV_S | VBUS voltage |
| VDD | S | Digital Supply Voltage |
| NCS | D_I | SPI chip select |
| SDI/RXD | D_I | SPI or UART data input |
| SDO/TXD | D_O | SPI or UART data output |
| SCLK | D_I | SPI clock input |
| NRES | D_I | Negative reset and test mode pin |
| TRIG | D_I | Sync pulse trigger input |
| SIF1 | HV_A_O | Sensor Interface 1 |
| SIF2 | HV_A_O | Sensor Interface 2 |
| SIF3 | HV_A_O | Sensor Interface 3 |
| SIF4 | HV_A_O | Sensor Interface 4 |

The type abbreviations used in Table 1 include "A" for analog, "D" for digital, "S" for supply, "I" for input, "O" for output, and "HV" for high voltage. As shown in Table 1, the type designations can be combined (e.g., "HV_S" refers to a high voltage supply signal, "HV_A_O" refers to a high voltage analog output, and so on).

The ECU transceiver 500 supports various supply voltage options to support different applications. The different supply voltage options may involve external components and can be selected by SPI or UART commands to the ECU transceiver 500. The VBUS LDO controller 540 operates to receive the inlet power supply signal (VSUPPLY) and generate a stable internal bus power supply signal (VBUS). Different VBUS voltage levels are possible and can be selected. The channels SIF1-SIF4 provide voltage and current levels to satellite components by selectively providing VBUS to a given output node. As described herein, the pulse generator 112 employs a bootstrap arrangement to selectively add a pulse to the outlet power signal provided to a channel. The pulse operation for the pulse generator 112 can be triggered by the TRIG signal, UART/SPI command, or other signaling options. In accordance with at least some embodiments, the ECU transceiver 500 also includes over current and reverse current protection (e.g., provided by bus controller and protection circuitry 504, current limiter 510, and active discharge circuitry 514). In the event of a voltage or current error along a channel, the error detection circuitry 512 can track and record such errors (e.g., using one or more registers). Additional features may be supported by the ECU transceiver 500. For more information regarding other features supported by the ECU transceiver 500, reference may be had to the PSI5 specification. Also, it should be understood that for at least some embodiments, the ECU transceiver 500 does not follow the PSI5 specification and thus certain features may be omitted or may vary. Regardless of the set of features included with the ECU transceiver, the benefit of using the pulse generator 112 (with bootstrap arrangement) for the ECU transceiver 500 compared to using a charge pump arrangement corresponds to a reduction in the overall size, cost, and power dissipation.

As an example comparison for an ECU transceiver that supports four channels, the build of materials (BOM) for a charge pump arrangement to manage pulse generation includes an external charge pump capacitor (e.g., 270 nF) and 3 or 4 capacitors, each with a size of 4.7 µF. In contrast, the BOM for a bootstrap arrangement to manage pulse generation includes four capacitors, each with a size of 3.3 µF. The total power dissipation for a charge pump arrangement for four channels is estimated to be 374 mW. In contrast, the total power dissipation for a bootstrap arrangement for four channels is estimated to 58 mW. Also, the die area for a charge pump arrangement for four channels is estimated to be at least 1.1 mm². In contrast, the die area for a bootstrap arrangement for four channels is estimated to be 0.25 mm². The bootstrap arrangement also provides the benefit of avoiding a gate level shifter and high-voltage transistor as would be used for a charge pump arrangement. The bootstrap arrangement also reduces the amount of switching activity and avoids spikes on the inlet power supply signal (VSUPPLY). In an example charge pump arrangement, VSUPPLY is used the charge the charge pump capacitors. Meanwhile, in at least some bootstrap arrangement embodiments, the internal bus power supply signal (VBUS) is used for the pulse scheme and/or to recharge the bootstrap capacitor after a discharge.

Figure 6A:
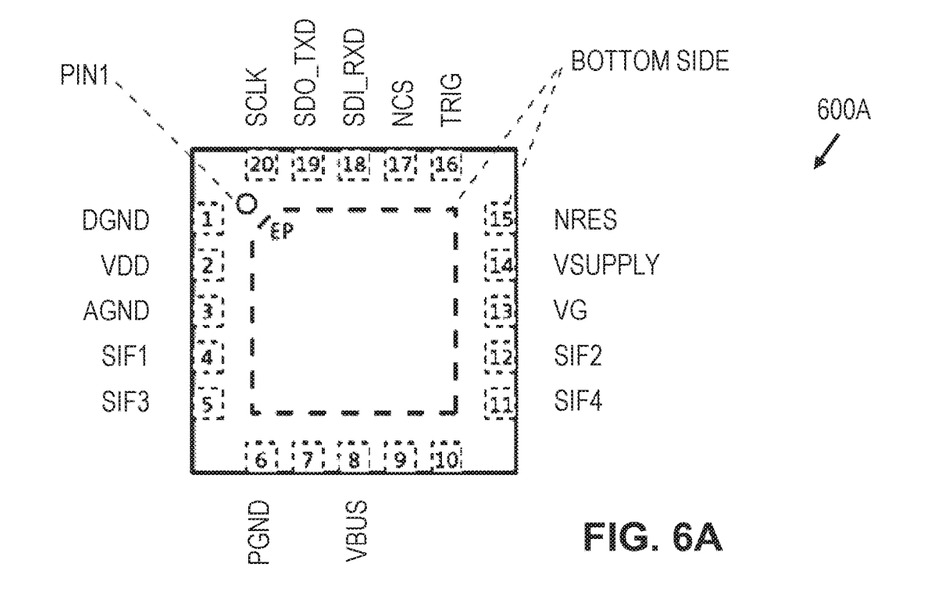
FIGS. 6A and 6B are illustrative electronic chips related to the ECU transceiver of FIG. 5.
Figure 6B:
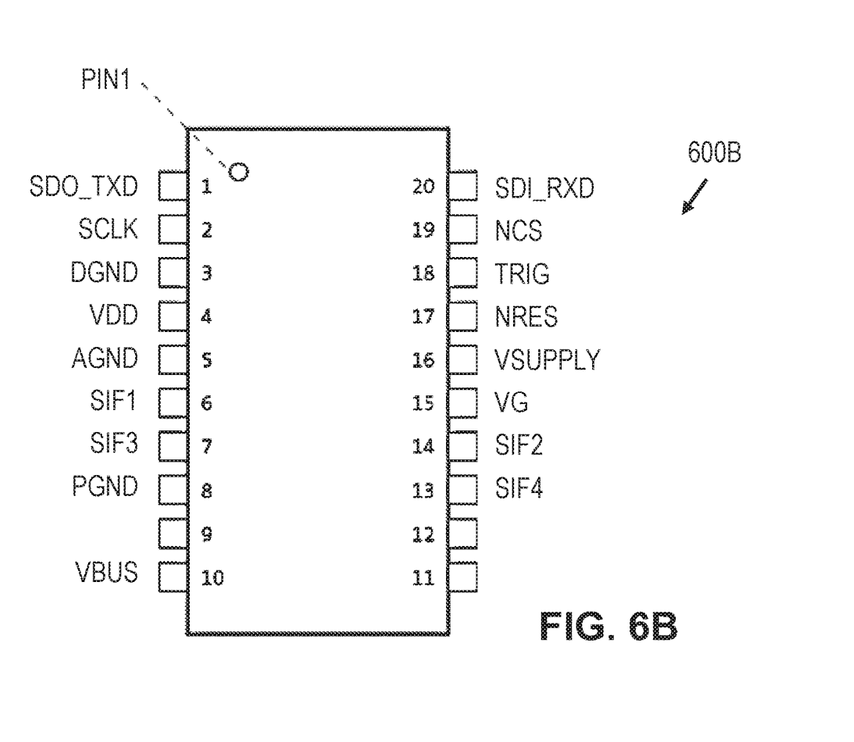

FIGS. 6A and 6B are illustrative electronic chips 600A and 600B related to the ECU transceiver 500 of FIG. 5. In FIG. 6A, electronic chip 600A corresponds to ECU transceiver 500 in the form of a packaged integrated circuit in a square shape. The various inputs and outputs described for the ECU transceiver 500 correspond to different pins of the electronic chip 600A. In addition, the pins for the electronic chip 600A include an analog ground (AGND), a digital ground (DGND) and a power ground (PGND) not mentioned previously. In different embodiments, the pin locations for the electronic chip 600A can be adjusted. Also, the electronic chip 600A of FIG. 6A shows that some pins can be omitted compared to an ECU transceiver with a charge pump arrangement.

In FIG. 6B, electronic chip 600B corresponds to ECU transceiver 500 in the form of a packaged integrated circuit in a rectangular shape. Again, the various inputs and outputs described for the ECU transceiver 500 correspond to different pins of the electronic chip 600B. In addition, the pins for the electronic chip 600B include an analog ground (AGND), a digital ground (DGND) and a power ground (PGND). In different embodiments, the pin locations for the electronic chip 600B can be adjusted. Also, the electronic chip 600B of FIG. 6B shows that some pins can be omitted compared to an ECU transceiver with a charge pump arrangement.

Figure 7:
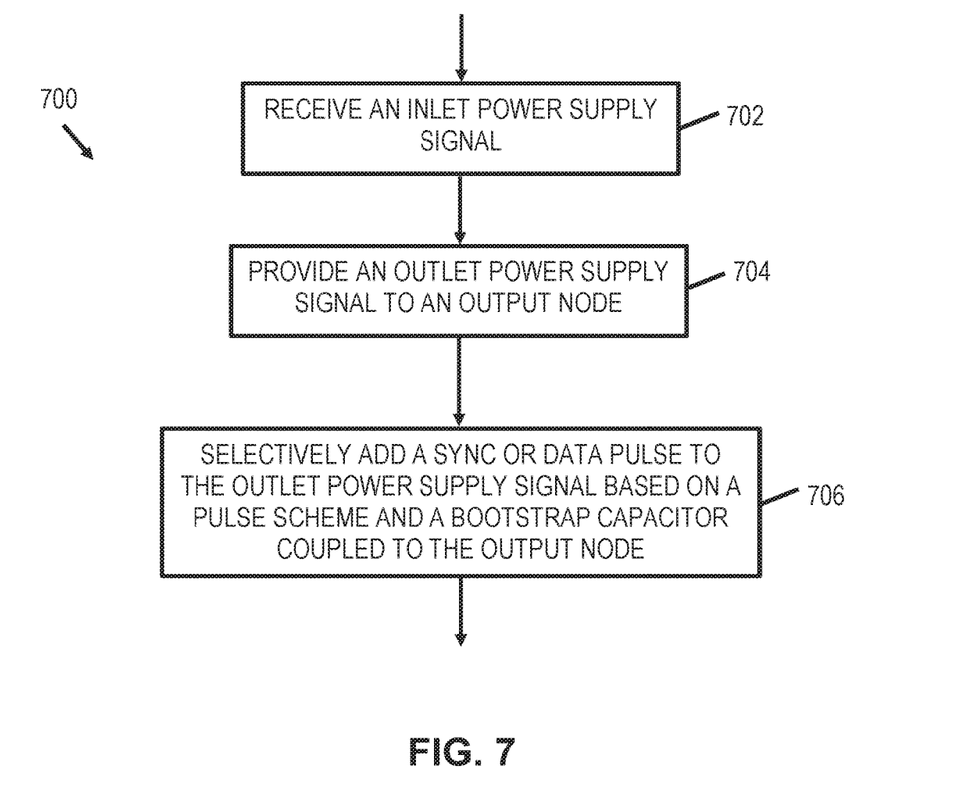
FIG. 7 shows a flowchart of an illustrative transceiver method.

FIG. 7 shows a flowchart of an illustrative transceiver method 700. In method 700, an inlet power supply signal is received (block 702) and an outlet power supply signal is provided (block 704), wherein the outlet power supply signal is based on the inlet power supply signal. At block 706, a sync or data pulse is selectively added to the outlet power supply signal based on a pulse scheme and a bootstrap capacitor coupled to the output node. In at least some embodiments, the pulse scheme of block 706 comprises providing a first current to a bottom side of the bootstrap capacitor to add a rising edge of the data or sync pulse to the outlet power supply signal. The pulse scheme of block 706 may further comprise providing a second current to the bottom side of the bootstrap capacitor to maintain the data or sync pulse at a threshold level above the outlet power supply signal for a predetermined duration. The pulse scheme of block 706 may also comprise grounding the bottom side of the bootstrap capacitor for a predetermined duration to add a falling edge of the data or sync pulse to the outlet power supply signal. In at least some embodiments, the pulse scheme of block 706 provides sync or data pulses in compliance with peripheral sensor interface 5 (PSI5).

These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A transceiver device that comprises:
an output node;
an internal bus that conveys an outlet power supply signal to the output node; and
a pulse generator coupled to the internal bus to selectively add at least one pulse to the outlet power supply signal the pulse generator including:
a capacitor with a first side coupled to the internal bus; and
at least one current source coupled to a second side of the capacitor to provide a first current to create a rising edge of the at least one pulse and to provide a second current to maintain the at least one pulse at a threshold level above the power supply voltage level for a predetermined duration.

2. The transceiver device of claim 1, wherein the pulse generator includes a pulse manager that enables the second side of the capacitor to be selectively connected to different current sources and to ground.

3. The transceiver device of claim 2, wherein at least one of the different current sources is powered by an internal bus power supply signal.

4. The transceiver device of claim 2, wherein the pulse manager adds a synchronization pulse having a predetermined shape to the outlet power supply signal.

5. The transceiver device of claim 4, wherein the pulse manager adds a data pulse to the outlet power supply signal, and wherein the data pulse has a different shape than the synchronization pulse.

6. The transceiver device of claim 1, further comprising a modulated data detector coupled to the internal bus.

7. The transceiver device of claim 1, wherein the output node, the internal bus, and the pulse generator are components of an integrated circuit.

8. The transceiver device of claim 1, wherein the pulse generator provides pulses to a plurality of channels.

9. An electronic control unit (ECU) transceiver for a vehicle, the ECU transceiver comprising:
a data detector;
a pulse generator;
an output node; and
an internal bus that couples the data detector and the pulse generator to the output node,
wherein the pulse generator is configured to selectively add a data or sync pulse to an outlet power supply signal conveyed by the internal bus to the output node,
wherein the pulse generator includes a capacitor with a first side coupled to the internal bus and a second side selectively coupled to at least one current source,
wherein the at least one current source is configured to provide a first current to the second side of the capacitor to add a rising edge of the data or sync pulse to the outlet power supply signal, and
wherein the at least one current source is configured to provide a second current to the second side of the capacitor to maintain the data or sync pulse at a threshold level above the outlet power supply signal for a predetermined duration.

10. The ECU transceiver of claim 9, wherein the second side of the capacitor is disconnected from the current source and is grounded for a predetermined duration to add a falling edge of the data or sync pulse to the outlet power supply signal.

11. The ECU transceiver of claim 9, wherein sensing operations of the data detector account for an amount of current applied to recharge the capacitor when completing a pulse.

12. The ECU transceiver of claim 9, wherein the data detector, the output node, the internal bus and the pulse generator are components of an integrated circuit.

13. The ECU transceiver of claim 9, wherein the ECU transceiver corresponds to a peripheral sensor interface (PSI) transceiver configured to add sync or data pulses to the outlet power supply signal without a charge pump.

14. The ECU transceiver of claim 9, wherein the pulse generator supports a plurality of channels.

15. A transceiver method that comprises:
providing an outlet power supply signal to an output node; and
using a capacitor with a top side coupled to the output node to selectively add a sync or data pulse to the outlet power supply signal in accordance with a pulse scheme,
wherein the pulse scheme comprises providing a first current to a bottom side of the capacitor to add a rising edge of the data or sync pulse to the outlet power supply signal, and
wherein the pulse scheme further comprises providing a second current to the bottom side of the capacitor to maintain the data or sync pulse at a threshold level above the outlet power supply signal for a predetermined duration.

16. The transceiver method of claim 15, wherein the pulse scheme further comprises grounding the bottom side of the capacitor for a predetermined duration to add a falling edge of the data or sync pulse to the outlet power supply signal.

17. The transceiver method of claim 15, wherein the pulse scheme provides sync or data pulses in compliance with peripheral sensor interface 5 (PSI5).

18. The transceiver method of claim 15, further comprising receiving modulated current from a sensor, measuring the modulated current, and adjusting a measured current based on a measured or estimated current used to recharge the capacitor when completing a data or sync pulse.

* * * * *